(12) United States Patent
Kataria et al.

(10) Patent No.: US 9,568,551 B1
(45) Date of Patent: Feb. 14, 2017

(54) SCAN WRAPPER CIRCUIT FOR INTEGRATED CIRCUIT

(71) Applicant: FREESCALE SEMICONDUCTOR, INC., Austin, TX (US)

(72) Inventors: Sagar Kataria, Noida (IN); Anurag Jindal, Patiala (IN); Abhishek Mahajan, Chandigarh (IN); Mayank Parasrampuria, Jaipur (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/855,396

(22) Filed: Sep. 16, 2015

(51) Int. Cl.
*G01R 31/317* (2006.01)
*G01R 31/3177* (2006.01)
*G01R 31/3185* (2006.01)

(52) U.S. Cl.
CPC ..... *G01R 31/3177* (2013.01); *G01R 31/31727* (2013.01); *G01R 31/318536* (2013.01); *G01R 31/318541* (2013.01); *G01R 31/318508* (2013.01); *G01R 31/318547* (2013.01); *G01R 31/318558* (2013.01); *G01R 31/318572* (2013.01)

(58) Field of Classification Search
CPC ............... G01R 31/318572; G01R 31/318541; G01R 31/318536; G01R 31/318547; G01R 31/318558; G01R 31/318508
USPC ........................................................ 714/727
See application file for complete search history.

(56) References Cited

U.S. PATENT DOCUMENTS

| 7,380,181 | B2 | 5/2008 | Goel | |
|---|---|---|---|---|
| 7,506,231 | B2 | 3/2009 | Chang | |
| 7,620,866 | B2 * | 11/2009 | Marinissen | G01R 31/31701 714/727 |
| 7,673,203 | B2 * | 3/2010 | Park | G01R 31/31725 714/726 |
| 8,555,123 | B2 * | 10/2013 | Wu | G06F 11/2236 714/727 |
| 8,694,951 | B1 * | 4/2014 | Prasanna | G06F 17/5045 714/726 |

(Continued)

OTHER PUBLICATIONS

Saman Adham et al.; "Preliminary Outline of the IEEE P1500 Scalable Architecture for Testing Embedded Cores", Proceedings of the 17th IEEE VLSI Test Symposium, 1999, pp. 482-488.

(Continued)

*Primary Examiner* — James C Kerveros
(74) *Attorney, Agent, or Firm* — Charles E. Bergere

(57) ABSTRACT

An integrated circuit (IC), operable in internal and external testing modes (INTEST and EXTEST), includes first and second partitions and a functional path therebetween. The first partition includes a first scan chain, a first multiplexer, and a first flip-flop. The second partition includes a second flip-flop and a second scan chain. The first scan chain generates an EXTEST vector initialization signal, based on an EXTEST scan input signal. The first multiplexer receives an INTEST vector initialization signal and the EXTEST vector initialization signal, and generates a scan input signal. The first flip-flop generates a first output signal based on the scan input signal. The functional path provides a second output signal based on the first output signal. The second flip-flop generates a third output signal based on the second output signal. The second scan chain receives the third output signal and generates a test output signal.

12 Claims, 3 Drawing Sheets

(56) References Cited

U.S. PATENT DOCUMENTS

| | | | | |
|---|---|---|---|---|
| 8,738,978 B2* | 5/2014 | Tekumalla | ..... | G01R 31/318533 |
| | | | | 714/726 |
| 8,914,689 B2* | 12/2014 | Marinissen | .... | G01R 31/318552 |
| | | | | 714/724 |
| 2003/0191996 A1* | 10/2003 | Mukherjee | ......... | G01R 31/3193 |
| | | | | 714/724 |
| 2006/0156104 A1* | 7/2006 | Chang | ............ | G01R 31/318555 |
| | | | | 714/724 |
| 2013/0047046 A1* | 2/2013 | Goel | ...................... | G11C 29/56 |
| | | | | 714/727 |

OTHER PUBLICATIONS

Qiang Xu; Nicolici, N.; Chakrabarty, K.; "Test Wrapper Design and Optimization Under Power Constraints for Embedded Cores With Multiple Clock Domains", IEEE Transactions on Computer-Aided Design of Integrated Circuits and Systems, vol. 26, No. 8, Aug. 2007.

* cited by examiner

US 9,568,551 B1

SCAN WRAPPER CIRCUIT FOR INTEGRATED CIRCUIT

BACKGROUND

The present invention relates generally to integrated circuits, and more particularly, to an integrated circuit with test circuitry.

Integrated circuits (ICs) may have manufacturing defects caused by, for example, contamination by dust particles during fabrication, which can cause the ICs to malfunction. Thus, testing ICs to detect manufacturing defects is essential. Design for Test (DFT) techniques add testability features to ICs to enable identification of manufacturing defects. DFT techniques allow an Automatic Test Equipment (ATE) to execute various fault tests on ICs. The ATE uses test patterns generated by test pattern generators, such as Automatic Test Pattern Generators (ATPGs), Pseudo-Random Pattern Generators (PRPGs), and the like, to detect faults.

Scan testing is a well-known DFT technique. During scan testing, shift and capture operations are performed, in which test patterns are shifted through the scan chain. A flat shift operation on large designs is not feasible due to tester pin limitations and power considerations. For this reason, today's ICs typically are divided into multiple partitions, where each partition can do shift operations independently, and each partition includes multiple scan chains.

Partitioned scan requires partitions to be isolated from each other through mechanisms like x-blocking where all inputs of the partition are driven from a node internal to the partition (INTEST mode or internal scan testing). After covering partitions individually the inter-partition paths/nodes are covered using scan wrappers (EXTEST mode or external scan testing). INTEST is performed on a functional path within a partition, and EXTEST is performed on a functional path between two partitions.

Referring to FIG. 1, a schematic block diagram of a conventional IC 100 that is operable in INTEST and EXTEST modes is shown. The IC 100 includes first and second partitions 102 and 104. The first partition 102 includes a first flip-flop 106, a first combinational circuit 108, a first multiplexer 110, and a first scan chain 112. The second partition 104 includes a second multiplexer 114, a second combinational circuit 116, a compression circuit 118, a second scan chain 120, and a second flip-flop 122.

The first flip-flop 106 has receives a first input signal ($V_{IN\_1}$), a clock signal ($V_{CLK}$), a scan enable signal ($V_{SE}$), and outputs a first output signal ($V_{OUT\_1}$). The scan enable signal indicates either a shift operation or a capture operation. The first combinational circuit 108 is connected to the output of the first flip-flop 106 for receiving the first output signal and generating a second output signal ($V_{OUT\_2}$). The first scan chain 112 receives a scan input signal ($V_{SI}$) and generates a scan output signal ($V_{SO}$) during the shift operation, where the scan input signal is a test pattern provided to the first scan chain 112 by an ATE (not shown).

The first multiplexer 110 is connected to the first combinational circuit 108 for receiving the second output signal, and to a flip-flop of the first scan chain 112 for receiving a scan vector initialization signal ($V_{INIT}$). A select terminal receives an EXTEST mode control signal ($V_{EXTEST\_MODE}$), and the first multiplexer 110 outputs one of the second output signal and the scan vector initialization signal as a third output signal ($V_{OUT\_3}$). The scan vector initialization signal indicates a test pattern being applied to the IC 100 in the EXTEST mode. The first scan chain 112 generates the scan vector initialization signal during the shift operation. The EXTEST mode control signal indicates whether the IC 100 is in the EXTEST mode. A path between the first and second scan chains 112 and 120 (hereinafter referred to as "functional path between the first and second partitions 102 and 104") is tested during the EXTEST mode.

The second multiplexer 114 receives the third output signal and a second input signal ($V_{IN\_2}$), and outputs a fourth output signal ($V_{OUT\_4}$) based on a select input, which is an inverted version of the EXTEST mode control signal ($V_{IN}$-$V_{EXTEST\_MODE}$). The second combinational circuit 116 is connected to the output of the second multiplexer 114 for receiving the fourth output signal and generating a fifth output signal ($V_{OUT\_5}$). The second flip-flop 122 is connected to the second combinational circuit 116 for receiving the fifth output signal, and outputs a sixth output signal ($V_{OUT\_6}$).

The compression circuit 118 is connected to the second multiplexer 114 for receiving the fourth output signal and generating a compressed output signal ($V_{COMP\_OUT}$). The compression circuit 118 provides the compressed output signal to a flip-flop of the second scan chain 120 during the capture operation.

The second scan chain 120 receives the compressed output signal from the compression circuit 118 during the capture operation. The second scan chain 120 also receives a test input signal ($V_{TEST\_IN}$) during the shift operation. The test input signal is a test pattern provided to the second scan chain 120 by the ATE. The second scan chain 120 generates a test output signal ($V_{TEST\_OUT}$) during the shift operation, thereby testing the functional path between the first and second partitions 102 and 104. The test output signal is compared with a known value to determine if the IC 100 contains a fault. However, this method adds muxes to the functional path, which impacts the timing of functional signals by adding propagation delays. Further, the test logic does not facilitate testing the path between the first and second flip-flops 106 and 112. It would be advantageous to have a testable IC that reduces the impact on the propagation delay of a functional path between partitions.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
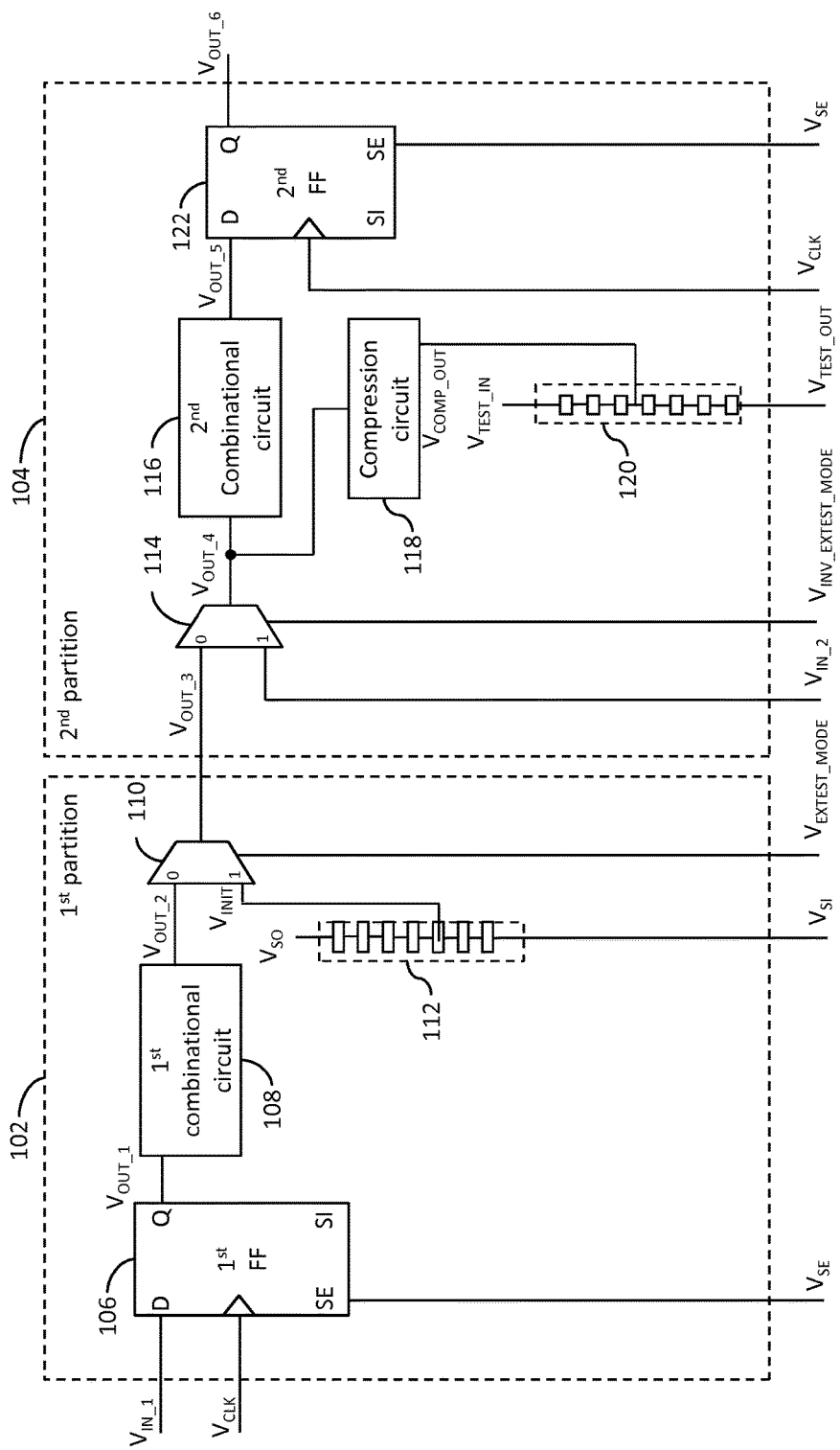
FIG. 1 is a schematic block diagram of a conventional IC that is operable in INTEST and EXTEST modes.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention is directed to a scan-testable IC having multiple partitions. Scan wrapper flip-flops have data shifted in through scan patterns, and this shift data is used to initialize periphery flip-flops outputs. Partition output flops are initialized through scan path (SI pin) by placing a mux before the flip-flop. Values can be launched from these partition output flops and captured at other partitions. Data captured at the other partitions can be compressed, such as with multi-stage XOR logic and transferred to wrapper cells of a receiving end partition. Wrapper cells now have the captured data in compressed form, which can be shifted out.

The present invention also provides a shift register clock control circuit that is initialized to a value '10000' when scan enable is activated (e.g., when scan enable goes high). When scan enable goes low, a test clock TCK is pulsed, generating a design shift pulse for each of the partition, one by one, and the last stage of the shift register generates the initialization pulse for the transition delay pattern.

In an embodiment of the present invention, an integrated circuit (IC) is provided. The IC is operable in an internal test (INTEST) mode and an external test (EXTEST) mode. The IC includes first and second partitions and a functional path. The first partition includes a first scan chain, a first multiplexer, and a first flip-flop. The second partition includes a second flip-flop and a second scan chain. The first scan chain receives a first clock signal and an EXTEST scan input signal and generates an EXTEST vector initialization signal. The first multiplexer has a first input terminal for receiving an INTEST vector initialization signal, a second input terminal for receiving the EXTEST vector initialization signal, a select terminal for receiving an EXTEST mode control signal, and an output terminal for outputting at least one of the INTEST vector initialization signal and the EXTEST vector initialization signal as a scan input signal. The EXTEST mode control signal is indicative of whether the IC is in the EXTEST mode. The first flip-flop has an input terminal for receiving a first input signal, a clock terminal for receiving a second clock signal, a scan input terminal for receiving the scan input signal, a scan enable terminal for receiving a scan enable signal, and an output terminal for generating a first output signal. The scan enable signal is indicative of at least one of a shift operation and a capture operation. The second flip-flop has an input terminal for receiving a second output signal, a clock terminal for receiving a third clock signal, a scan enable terminal for receiving the scan enable signal, and an output terminal for generating a third output signal. The second scan chain receives the first clock signal and the third output signal and generates a test output signal. The functional path lies between the first and second flip-flops. The functional path receives the first output signal and generates the second output signal. The functional path is subject to testing when the IC is in the EXTEST mode.

In another embodiment of the present invention, an IC is provided. The IC is operable in INTEST and EXTEST modes. The IC includes first and second partitions and a functional path. The first partition includes a first scan chain, a first multiplexer, and a first flip-flop. The second partition includes second and third flip-flops, a compression circuit, and a second scan chain. The first scan chain receives a first clock signal and an EXTEST scan input signal and generates an EXTEST vector initialization signal. The first multiplexer has a first input terminal for receiving an INTEST vector initialization signal, a second input terminal for receiving the EXTEST vector initialization signal, a select terminal for receiving an EXTEST mode control signal, and an output terminal for outputting at least one of the INTEST vector initialization signal and the EXTEST vector initialization signal as a scan input signal. The EXTEST mode control signal is indicative of whether the IC is in the EXTEST mode. The first flip-flop has an input terminal for receiving a first input signal, a clock terminal for receiving a second clock signal, a scan input terminal for receiving the scan input signal, a scan enable terminal for receiving a scan enable signal, and an output terminal for generating a first output signal. The scan enable signal is indicative of at least one of a shift operation and a capture operation. The second flip-flop has an input terminal for receiving a second output signal, a clock terminal for receiving a third clock signal, a scan enable terminal for receiving the scan enable signal, and an output terminal for generating a third output signal. The third flip-flop has an input terminal for receiving a fourth output signal, a clock terminal for receiving the third clock signal, a scan enable terminal for receiving the scan enable signal, and an output terminal for generating a fifth output signal. The compression circuit receives the third and fifth output signals and generates a compressed output signal. The second scan chain receives the first clock signal and the compressed output signal and generates a test output signal. The functional path lies between the first and second flip-flops. The functional path receives the first output signal and generates the second and fourth output signals. The functional path is subject to testing when the IC is in the EXTEST mode.

Various embodiments of the present invention provide an IC, which is operable in an INTEST mode and an EXTEST mode. The IC includes first and second partitions and a functional path between the first and second partitions. The first partition includes a first scan chain, a first multiplexer, and a first flip-flop. The second partition includes a second flip-flop and a second scan chain. The first scan chain receives a first clock signal and an EXTEST scan input signal, and generates an EXTEST vector initialization signal. The EXTEST vector initialization signal is indicative of a test pattern applied to the IC in the EXTEST mode. The first multiplexer receives an INTEST vector initialization signal, the EXTEST vector initialization signal, and an EXTEST mode control signal, and generates a scan input signal. The EXTEST mode control signal is indicative of whether the IC is in the EXTEST mode. The first flip-flop receives a first input signal, a second clock signal, the scan input signal, and a scan enable signal, and generates a first output signal. The scan enable signal is indicative of at least one of a shift operation and a capture operation. The second flip-flop receives a second output signal, a third clock signal, and the scan enable signal, and generates a third output signal. The second scan chain receives the first clock signal and the third output signal, and generates a test output signal. The test output signal is indicative of the response of the functional path to the test pattern. The functional path lies between the first and second flip-flops, receives the first output signal and generates the second output signal. The functional path is subject to testing when the IC is in the EXTEST mode. The test output signal is compared to a predetermined output signal to determine faults in the IC. Thus, the functional path between the first and second flip-flops is tested, thereby improving the quality of the test. The functional path does not include multiplexers, thereby reducing degradation of the propagation delay of the functional path.

Figure 2:
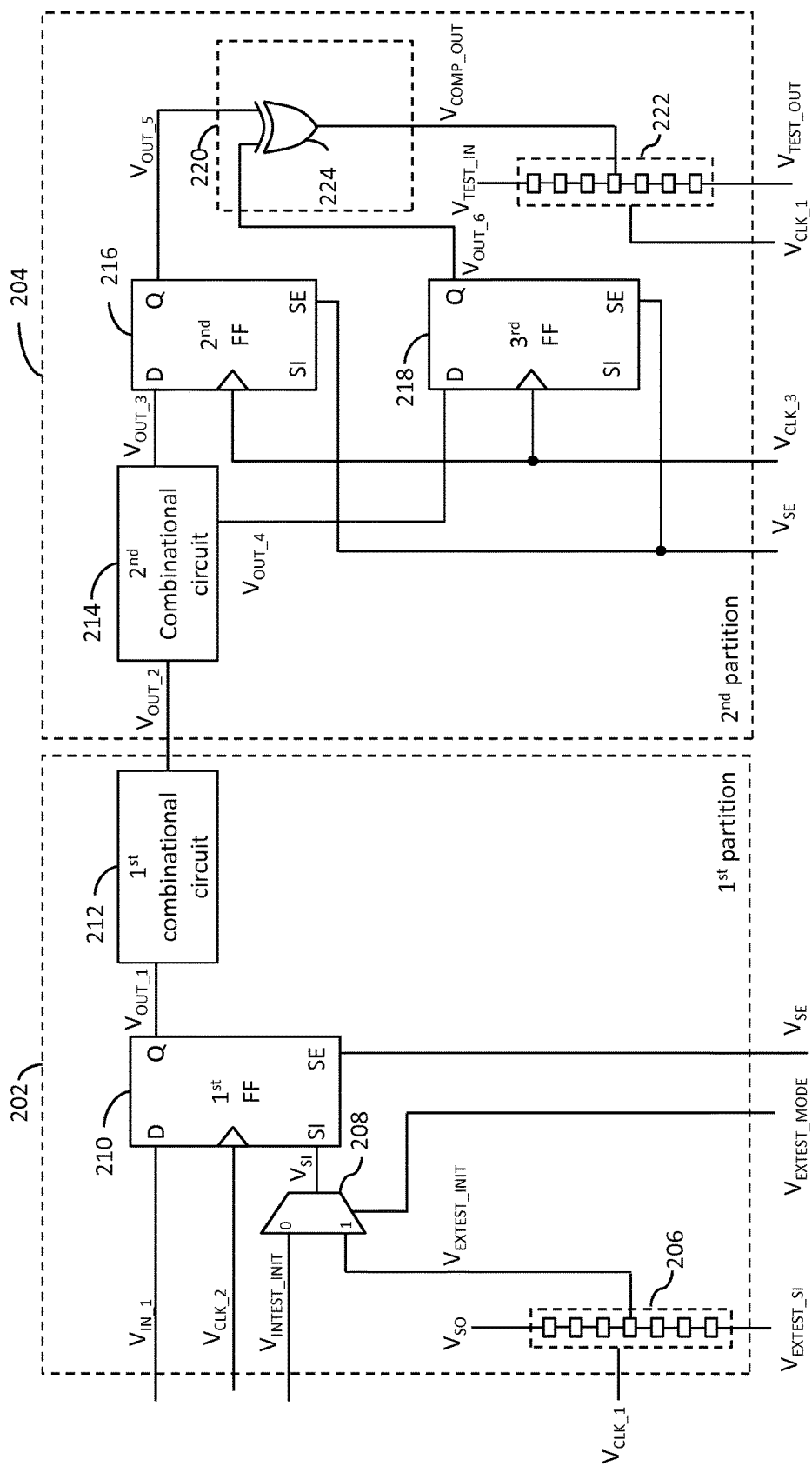
FIG. 2 is a schematic block diagram of an IC that is operable in INTEST and EXTEST modes in accordance with an embodiment of the present invention.

Referring now to FIG. 2, a schematic block diagram of an integrated circuit (IC) 200 that is operable in an internal test (INTEST) mode and an external test (EXTEST) mode in accordance with an embodiment of the present invention is shown. The IC 200 includes first and second partitions 202 and 204. The first partition 202 includes a first scan chain 206, a first multiplexer 208, a first flip-flop 210, and a first combinational circuit 212. The second partition 204 includes a second combinational circuit 214, second and third flip-flops 216 and 218, a compression circuit 220, and a second scan chain 222.

When the IC 200 operates in the INTEST mode, a path within the first partition 202 or the second partition 204 is tested. When the IC 200 operates in the EXTEST mode, a path between the first and second flip-flops 210 and 216 (hereinafter referred to as "functional path") is tested. In an example, the functional path includes the first and second combinational circuits 212 and 214.

The first scan chain 206 receives a first clock signal ($V_{CLK\_1}$) and an EXTEST scan input signal ($V_{EXTEST\_SI}$), and generates a scan output signal ($V_{SO}$) during the shift operation.

The first multiplexer 208 has a first input terminal for receiving an INTEST vector initialization signal ($V_{INTEST\_INIT}$), a second input terminal connected to a flip-flop of the first scan chain 206 for receiving an EXTEST vector initialization signal ($V_{EXTEST\_INIT}$), a select terminal for receiving an EXTEST mode control signal ($V_{EXTEST\_MODE}$), and an output terminal for outputting at least one of the INTEST vector initialization signal and the EXTEST vector initialization signal as a scan input signal ($V_{SI}$). The EXTEST vector initialization signal is indicative of a first test pattern applied to the IC 200 when the IC 200 is in the EXTEST mode. The INTEST vector initialization signal is indicative of a second test pattern applied to the IC 200 when the IC 200 is in the INTEST mode. Thus, the scan input signal is the INTEST vector initialization signal when the IC 200 is in the INTEST mode, and the scan input signal is the EXTEST vector initialization signal when the IC 200 is in the EXTEST mode.

The first flip-flop 210 has an input terminal for receiving a first input signal ($V_{IN\_1}$), a clock terminal for receiving a second clock signal ($V_{CLK\_2}$), a scan input terminal for receiving the scan input signal, a scan enable terminal for receiving a scan enable signal ($V_{SE}$), and an output terminal for generating a first output signal ($V_{OUT\_1}$). The scan enable signal is indicative of at least one of a shift operation and a capture operation. During the shift operation, the first test pattern is shifted in the first scan chain 206.

The first combinational circuit 212 is connected to the output terminal of the first flip-flop 210 for receiving the first output signal and generating a second output signal ($V_{OUT\_2}$). The second combinational circuit 214 is connected to the first combinational circuit 212 for receiving the second output signal and generating third and fourth output signals ($V_{OUT\_3}$ and $V_{OUT\_4}$).

The second flip-flop 216 has an input terminal connected to the second combinational circuit 214 for receiving the third output signal, a clock terminal for receiving a third clock signal ($V_{CLK\_3}$), a scan enable terminal for receiving the scan enable signal, and an output terminal for generating a fifth output signal ($V_{OUT\_5}$).

The third flip-flop 218 has an input terminal connected to the second combinational circuit 214 for receiving the fourth output signal, a clock terminal for receiving the third clock signal, a scan enable terminal for receiving the scan enable signal, and an output terminal for generating a sixth output signal ($V_{OUT\_6}$).

The compression circuit 220 is connected to the second and third flip-flops 216 and 218 for receiving the fifth and sixth output signals, respectively. The compression circuit 220 generates a compressed output signal ($V_{COMP\_OUT}$) and provides the compressed output signal to a flip-flop of the second scan chain 222 during the capture operation. In an example, the compression circuit 220 includes an XOR gate 224, which has a first input terminal for receiving the fifth output signal, a second input terminal for receiving the sixth output signal, and an output terminal for generating the compressed output signal.

The second scan chain 222 receives the compressed output signal from the compression circuit 220 during the capture operation and the first clock signal. The second scan chain 222 further receives a test input signal ($V_{TEST\_IN}$) during the shift operation. In an example, the test input signal is provided by an Automatic Test Equipment (not shown). The second scan chain 222 generates a test output signal ($V_{TEST\_OUT}$) during the shift operation. The test output signal is indicative of the response of the IC 200 to the EXTEST vector initialization signal when the IC 200 is in the EXTEST mode. During the capture operation, the compressed output signal is shifted in the second scan chain 222.

Figure 3:
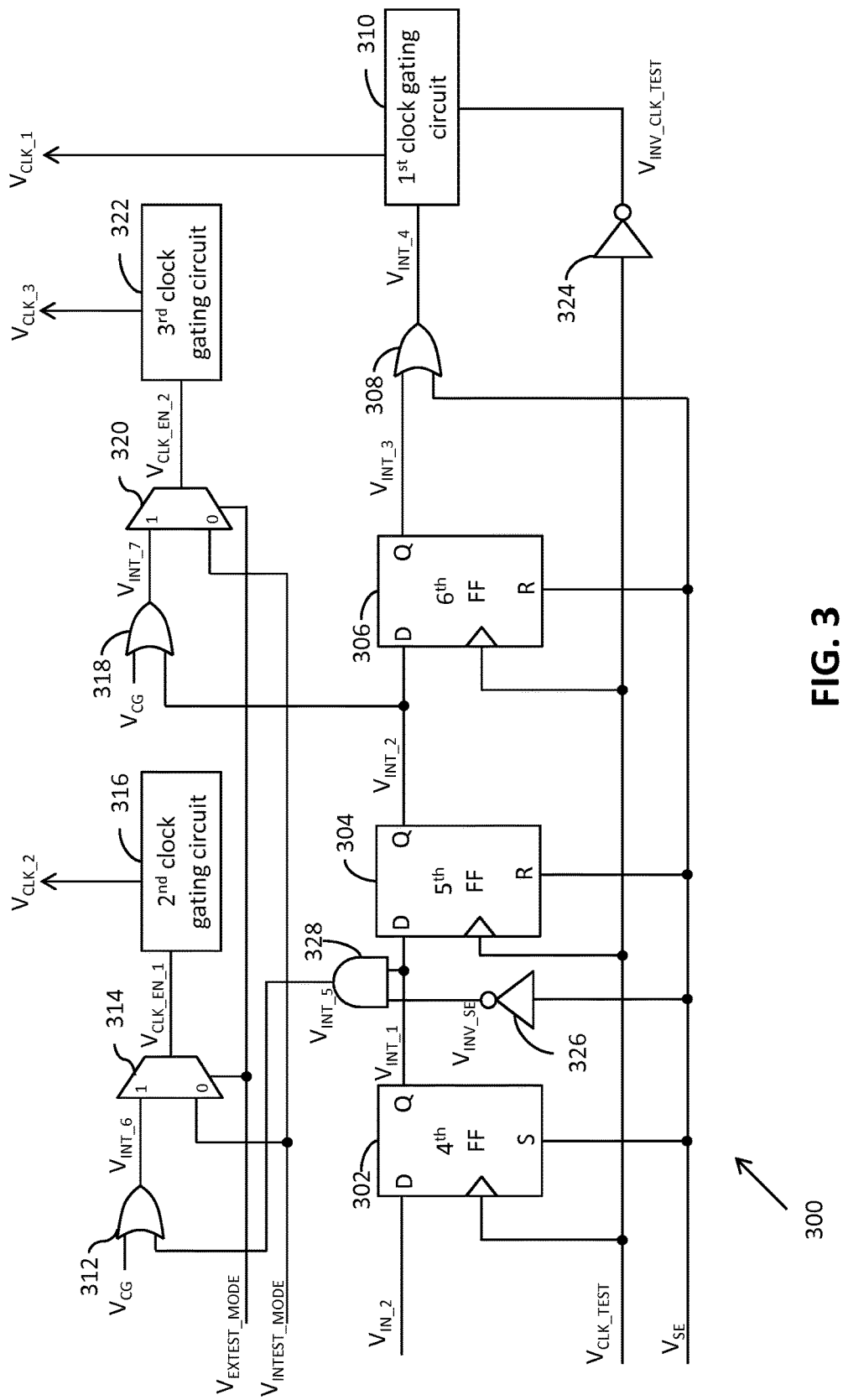
FIG. 3 is a schematic block diagram of a clock generator in accordance with an embodiment of the present invention.

Referring now to FIG. 3, a schematic block diagram of a clock generator 300 in accordance with an embodiment of the present invention is shown. The clock generator 300 is connected to the first and second partitions 202 and 204 for providing the first, second, and third clock signals. The clock generator 300 includes fourth through sixth flip-flops 302-306, a first OR gate 308, a first clock gating circuit 310, a second OR gate 312, a second multiplexer 314, a second clock gating circuit 316, a third OR gate 318, a third multiplexer 320, a third clock gating circuit 322, first and second inverters 324 and 326, and an AND gate 328.

The fourth flip-flop 302 has an input terminal for receiving a second input signal ($V_{IN\_2}$), a clock terminal for receiving a test clock signal ($V_{CLK\_TEST}$), a set terminal for receiving the scan enable signal, and an output terminal for generating a first intermediate signal ($V_{INT\_1}$).

The fifth flip-flop 304 has an input terminal connected to the output terminal of the fourth flip-flop 302 for receiving the first intermediate signal, a clock terminal for receiving the test clock signal, a reset terminal for receiving the scan enable signal, and an output terminal for generating a second intermediate signal ($V_{INT\_2}$).

The sixth flip-flop 306 has an input terminal connected to the output terminal of the fifth flip-flop 304 for receiving the second intermediate signal, a clock terminal for receiving the test clock signal, a reset terminal for receiving the scan enable signal, and an output terminal for generating a third intermediate signal ($V_{INT\_3}$).

The first OR gate 308 has a first input terminal connected to the output terminal of the sixth flip-flop 306 for receiving the third intermediate signal, a second input terminal for receiving the scan enable signal, and an output terminal for generating a fourth intermediate signal ($V_{INT\_4}$).

The first clock gating circuit 310 is connected to the first OR gate 308 for receiving the fourth intermediate signal. The first clock gating circuit 310 further receives an inverted version of the test clock signal ($V_{INV\_CLK\_TEST}$) by way of the first inverter 324. The first clock gating circuit 310 generates the first clock signal.

The AND gate 328 has a first input terminal for receiving an inverted version of the scan enable signal ($V_{INV\_SE}$) by way of the second inverter 326, a second input terminal connected to the output terminal of the fourth flip-flop 302 for receiving the first intermediate signal, and an output terminal for generating a fifth intermediate signal ($V_{INT\_5}$).

The second OR gate 312 has a first input terminal for receiving a clock gating signal ($V_{CG}$), a second input terminal connected to the output terminal of the AND gate 328 for receiving the fifth intermediate signal, and an output terminal for generating a sixth intermediate signal ($V_{INT\_6}$). The clock gating signal is indicative of at least one of activating and deactivating the first, second, and third clock signals.

The second multiplexer 314 has a first input terminal connected to the output terminal of the second OR gate 312 for receiving the sixth intermediate signal, a second input terminal for receiving an INTEST mode control signal ($V_{INTEST\_MODE}$), and an output terminal for outputting at least one of the sixth intermediate signal and the INTEST mode control signal as a first clock enable signal ($V_{CLK\_EN\_1}$). The second clock gating circuit 316 is connected to the second multiplexer 314 for receiving the first clock enable signal and generating the second clock signal.

The third OR gate 318 has a first input terminal for receiving the clock gating signal, a second input terminal connected to the output terminal of the fifth flip-flop 304 for receiving the second intermediate signal, and an output terminal for generating a seventh intermediate signal ($V_{INT\_7}$).

The third multiplexer 320 has a first input terminal connected to the output terminal of the third OR gate 318 for receiving the seventh intermediate signal, a second input terminal for receiving the INTEST mode control signal, and an output terminal for outputting at least one of the seventh intermediate signal and the INTEST mode control signal as a second clock enable signal ($V_{CLK\_EN\_2}$). The third clock gating circuit 322 is connected to the third multiplexer 320 for receiving the second clock enable signal and generating the third clock signal.

In operation, the clock generator 300 receives the scan enable signal at logic high state when the IC 200 is subject to scan testing. The first OR gate 308 receives the scan enable signal at logic high state and generates the fourth intermediate signal at logic high state. The first clock gating circuit 310 receives the fourth intermediate signal at logic high state and activates the first clock signal. The first scan chain 206 receives the first clock signal and the EXTEST scan input signal and generates the EXTEST vector initialization signal. As the IC 200 is in the EXTEST mode, the EXTEST mode control signal is at logic high state. The first multiplexer 208 receives the EXTEST mode control signal at logic high state and outputs the EXTEST vector initialization as the scan input signal.

Subsequently, the clock generator 300 activates the second clock signal. The first flip-flop 210 receives the second clock signal and generates the first output signal. The first combinational circuit 212 receives the first output signal and generates the second output signal. Subsequently, the clock generator 300 activates the third clock signal. The second combinational circuit 214 receives the second output signal and generates the third and fourth output signals. The second flip-flop 216 receives the third output signal and generates the fifth output signal. The third flip-flop 218 receives the fourth output signal and generates the sixth output signal. The compression circuit 220 receives the fifth and sixth output signals, and generates the compressed output signal. Subsequently, the clock generator 300 activates the first clock signal. The second scan chain 222 receives the first clock signal and the compressed output signal, and generates the test output signal, which is indicative of the response of the IC 200 to the first test pattern during the EXTEST mode. The test output signal is compared to a predetermined output signal for determining faults in the IC 200, thereby testing the functional path of the IC 200.

During the shift operation, the clock generator 300 deactivates the second and third clock signals and activates the first clock signal.

The functional path does not include multiplexers, thereby reducing degradation of the propagation delay of the functional path. Further, the clock generator 300 activates the first, second, and third clock signals sequentially. Therefore, the first and second partitions 202 and 204 are not activated simultaneously, thereby reducing the power consumption during the testing of the IC 200.

In an example, the functional path does not include the first and second combinational circuits 212 and 214. In another example, the functional path includes at least one of the first and second combinational circuits 212 and 214. Therefore, it will be apparent to one of skill in the art that testing of the IC 200 is not limited to the presence of the first and second combinational circuits 212 and 214 in the functional path.

It will be understood by those of skill in the art that the IC 200 may include a multiplexer and a flip-flop that are similar to the first multiplexer 208 and the first flip-flop 210, respectively, for each flip-flop of the first scan chain 206. Further, the IC 200 may include a compression circuit that receives output signals of more than two flip-flops in the second partition 204, which are similar to either of the second and third flip-flops 216 and 218, for compressing the received output signals and providing the compressed signal to a flip-flop of the second scan chain 222.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit operable in an internal test (INTEST) mode and an external test (EXTEST) mode, comprising:

a first partition, comprising:

a first scan chain for receiving a first clock signal and an EXTEST scan input signal and generating an EXTEST vector initialization signal;

a first multiplexer that receives an INTEST vector initialization signal and the EXTEST vector initialization signal, and provides a scan input signal based on an EXTEST mode control signal that indicates whether the integrated circuit is in the EXTEST mode; and a first flip-flop having an input terminal for receiving a first input signal, a clock terminal for receiving a second clock signal, a scan input terminal connected to the first multiplexer for receiving the scan input signal, a scan enable terminal for receiving a scan enable signal, and an output terminal for generating a first output signal, wherein the scan enable signal indicates one of a shift operation and a capture operation;

a second partition, comprising:
a second flip-flop having an input terminal for receiving a second output signal, a clock terminal for receiving a third clock signal, a scan enable terminal for receiving the scan enable signal, and an output terminal for generating a third output signal; and
a second scan chain for receiving the first clock signal and the third output signal and generating a test output signal;
a functional path connected to the output terminal of the first flip-flop for receiving the first output signal and generating the second output signal; and
a clock generator for receiving the scan enable signal, an INTEST mode control signal, the EXTEST mode control signal, a clock gating signal, a test clock signal, and a second input signal, and generating the first, second, and third clock signals, wherein the INTEST mode control signal indicates whether the integrated circuit is in the INTEST mode, and wherein the clock generator comprises:
a third flip-flop that receives the second input signal, the test clock signal, and the scan enable signal, and generates a first intermediate signal;
a fourth flip-flop connected to the third flip-flop and receiving the first intermediate signal, the test clock signal, and the scan enable signal, and generating a second intermediate signal;
a fifth flip-flop connected to the fourth flip-flop and receiving the second intermediate signal, the test clock signal, and the scan enable signal, and generating a third intermediate signal;
first logic gates that receive the first and third intermediate signals, as well as the scan enable signal and a clock gating signal, and generate fourth, fifth, sixth and seventh intermediate signals;
a second multiplexer that receives the sixth intermediate signal and the INTEST mode control signal, and outputs a first clock enable signal based on the EXTEST mode control signal;
a third multiplexer that receives the seventh intermediate signal and the INTEST mode control signal, and outputs a second clock enable signal based on the EXTEST mode control signal; and
clock gating circuitry that receives the test clock signal, the fourth intermediate signal, and the first and second clock enable signals, and generates the first, second and third clock signals.

2. The integrated circuit of claim 1, wherein the functional path includes a first combinational circuit, connected to the first flip-flop, for receiving the first output signal and generating the second output signal, wherein the first combinational circuit is located in the first partition.

3. The integrated circuit of claim 1, wherein the functional path includes a first combinational circuit, connected to the first flip-flop, for receiving the first output signal and generating the second output signal, wherein the first combinational circuit is located in the second partition.

4. The integrated circuit of claim 1, wherein the functional path includes first and second combinational circuits in the first and second partitions, respectively, and wherein the first combinational circuit is connected to the output terminal of the first flip-flop for receiving the first output signal and generating a fourth output signal, and the second combinational circuit is connected to the first combinational circuit for receiving the fourth output signal and generating the second output signal.

5. The integrated circuit of claim 1, wherein the clock generator activates at least one of the second and third clock signals for enabling at least one of the first and second flip-flops based on the clock gating signal.

6. The integrated circuit of claim 5, wherein the clock generator activates the first clock signal after activating the second and third clock signals when the scan enable signal is active, thereby enabling the first and second scan chains.

7. The integrated circuit of claim 1, wherein the clock generator activates at least one of the second and third clock signals for enabling at least one of the first and second flip-flops based on the clock gating signal.

8. The integrated circuit of claim 7, wherein the clock generator activates the first clock signal after activating the second and third clock signals when the scan enable signal is active, thereby enabling the first and second scan chains.

9. An integrated circuit operable in an internal test (INTEST) mode and an external test (EXTEST) mode, comprising:
a first partition, comprising:
a first scan chain for receiving a first clock signal and an EXTEST scan input signal and generating an EXTEST vector initialization signal;
a first multiplexer having a first input terminal for receiving an INTEST vector initialization signal, a second input terminal connected to the first scan chain for receiving the EXTEST vector initialization signal, a select terminal for receiving an EXTEST mode control signal, and an output terminal for outputting at least one of the INTEST vector initialization signal and the EXTEST vector initialization signal as a scan input signal, wherein the EXTEST mode control signal indicates whether the integrated circuit is in the EXTEST mode; and
a first flip-flop having an input terminal for receiving a first input signal, a clock terminal for receiving a second clock signal, a scan input terminal connected to the output terminal of the first multiplexer for receiving the scan input signal, a scan enable terminal for receiving a scan enable signal, and an output terminal for generating a first output signal, wherein the scan enable signal indicates at least one of a shift operation and a capture operation;
a second partition, comprising:
a second flip-flop having an input terminal for receiving a second output signal, a clock terminal for receiving a third clock signal, a scan enable terminal for receiving the scan enable signal, and an output terminal for generating a third output signal;
a third flip-flop having an input terminal for receiving a fourth output signal, a clock terminal for receiving the third clock signal, a scan enable terminal for receiving the scan enable signal, and an output terminal for generating a fifth output signal;
a compression circuit connected to the output terminals of the second and third flip-flops for receiving the third and fifth output signals, respectively, and generating a compressed output signal; and
a second scan chain for receiving the first clock signal and the compressed output signal and generating a test output signal;
a functional path connected to the output terminal of the first flip-flop for receiving the first output signal and generating the second and fourth output signals; and a clock generator for receiving the scan enable signal, an INTEST mode control signal, the EXTEST mode control signal, a clock gating signal, a test clock signal, and a second input signal, and generating the first, second, and third clock signals, wherein the INTEST mode control signal indicates whether the integrated circuit is in the INTEST mode, wherein the clock generator comprises:

a fourth flip-flop that receives the second input signal, the test clock signal, and the scan enable signal, and outputs a first intermediate signal;

a fifth flip-flop connected to the fourth flip-flop for receiving the first intermediate signal, as well as the test clock signal, and the scan enable signal, and outputs a second intermediate signal;

a sixth flip-flop connected to the fifth flip-flop for receiving the second intermediate signal, as well as the test clock signal, and the scan enable signal, and outputs a third intermediate signal;

first logic gates that receive as inputs the first, second, third and fifth intermediate signals, the scan enable signal, and the clock gating signal, and output fourth, fifth, sixth and seventh intermediate signals;

a second multiplexer connected to the first logic gates for receiving the sixth intermediate signal, and the INTEST mode control signal, and outputs a first clock enable signal based on the EXTEST mode control signal;

a third multiplexer connected to first logic gates for receiving the seventh intermediate signal, and the INTEST mode control signal, and outputting a second clock enable signal based on the EXTEST mode control signal; and clock gating circuitry that receives the test clock signal, the first and second clock enable signals, and the fourth intermediate signal, and generates the first, second and third clock signals.

10. The integrated circuit of claim 9, wherein the functional path includes a first combinational circuit connected to the first flip-flop for receiving the first output signal and generating the second and fourth output signals, the first combinational circuit is located in the first partition.

11. The integrated circuit of claim 9, wherein the functional path includes a first combinational circuit connected to the output terminal of the first flip-flop for receiving the first output signal, and generating the second and fourth output signals, wherein the first combinational circuit is located in the second partition.

12. The integrated circuit of claim 9, wherein the functional path includes first and second combinational circuits in the first and second partitions, respectively, and wherein the first combinational circuit is connected to the first flip-flop for receiving the first output signal and generating a sixth output signal, and the second combinational circuit is connected to the first combinational circuit for receiving the sixth output signal and generating the second and fourth output signals.

* * * * *